(12) United States Patent
Fang et al.

(10) Patent No.: US 6,408,318 B1
(45) Date of Patent: Jun. 18, 2002

(54) MULTIPLE STAGE DECIMATION FILTER

(76) Inventors: Xiaoling Fang, 11537 S. Berryknoll Cir., Draper, UT (US) 84020; Renyuan Huang, 3475 S. Imverary Dr.. #30, Salt Lake City, UT (US) 84124

( * ) Notice: Subject to any disclaimer, the term of this patent is extended or adjusted under 35 U.S.C. 154(b) by 0 days.

(21) Appl. No.: 09/286,263

(22) Filed: Apr. 5, 1999

(51) Int. Cl.$^7$ .............................................. G06F 17/10
(52) U.S. Cl. ...................................................... 708/313
(58) Field of Search .............................. 708/313, 319, 708/320, 443, 444; 375/350

(56) References Cited

U.S. PATENT DOCUMENTS

| | | | |
|---|---|---|---|
| 3,234,544 A | 2/1966 | Marenholtz | 340/347 |
| 3,298,019 A | 1/1967 | Nossen | 340/347 |
| 3,509,557 A | 4/1970 | Groth | 340/347 |
| 3,582,947 A | 6/1971 | Harrison | 340/347 |
| 3,678,501 A | 7/1972 | Prill | 340/347 AD |
| 3,692,959 A | 9/1972 | Lamp | 179/175.1 A |
| 3,750,142 A | 7/1973 | Barnes et al. | 340/347 CC |
| 3,894,195 A | 7/1975 | Kryter | 179/107 FD |
| 4,061,875 A | 12/1977 | Freifeld et al. | 179/1 P |
| 4,099,035 A | 7/1978 | Yanick | 179/107 FD |
| 4,114,149 A | 9/1978 | Kendall | 340/347 |
| 4,118,604 A | 10/1978 | Yanick | 179/107 FD |
| 4,135,590 A | 1/1979 | Gaulder | 179/1 P |
| 4,156,116 A | 5/1979 | Yanick | 179/107 R |
| 4,170,720 A | 10/1979 | Killion | 179/107 R |
| 4,187,413 A | 2/1980 | Moser | 179/107 FD |
| 4,188,667 A | 2/1980 | Graupe et al. | 364/724 |
| 4,210,903 A | 7/1980 | LaBrie | 340/347 NT |
| 4,232,192 A | 11/1980 | Beex | 179/1 FS |
| 4,237,449 A | 12/1980 | Zibell | 340/407 |
| 4,243,974 A | 1/1981 | Mack | 340/347 NT |
| 4,289,935 A | 9/1981 | Zollner et al. | 179/107 FD |
| 4,291,300 A | 9/1981 | Bader | 340/347 AD |
| 4,354,064 A | 10/1982 | Scott | 179/107 BC |
| 4,361,734 A | 11/1982 | Kahn | 179/107 R |
| 4,366,349 A | 12/1982 | Adelman | 179/107 FD |
| 4,388,494 A | 6/1983 | Schoöne et al. | 179/1 G |
| 4,390,756 A | 6/1983 | Hoffmann et al. | 179/107 BC |
| 4,393,275 A | 7/1983 | Feldman et al. | 179/1 VL |

(List continued on next page.)

FOREIGN PATENT DOCUMENTS

| | | | |
|---|---|---|---|
| DE | 44 41 996 | 5/1996 | H04R/25/00 |
| DE | 195 45 760 | 2/1997 | H04R/25/00 |
| EP | 0 341 903 | 5/1989 | H04R/25/00 |
| EP | 0 823 829 | 11/1998 | H04R/25/00 |
| WO | 98/28943 | 7/1998 | H04R/25/00 |
| WO | 99/26453 | 5/1999 | H04R/25/00 |

OTHER PUBLICATIONS

Bustamante, et al., "Measurement and Adaptive Suppression of Acoustic Feedback in Hearing Aids", Nicolet Instruments, Madison, Wisconsin, pp. 2017–2020.

(List continued on next page.)

Primary Examiner—David H. Malzahn
(74) Attorney, Agent, or Firm—Thelen Reid & Priest LLP; David B. Ritchie

(57) ABSTRACT

A decimation filter includes a zero insertion filter having an input and an output, wherein the input forms an input of the decimation filter; a cascade of four comb filters having a first accumulator stage and a second stage having a first differentiator portion and second differentiator portion wherein the first stage has an input coupled to the output of the zero insertion filter and an output, the first differentiator portion has an input coupled to the output of the first stage and an output, and the second differentiator portion has an input coupled to the output of the first differentiator portion and an output, and a frequency shaping filter having an input and an output, wherein the input is coupled to the output of the second differentiator portion and the output forms an output of the decimation filter.

1 Claim, 4 Drawing Sheets

U.S. PATENT DOCUMENTS

| | | | |
|---|---|---|---|
| 4,405,831 A | 9/1983 | Michelson | 179/1 P |
| 4,419,544 A | 12/1983 | Adelman | 179/107 FD |
| 4,441,202 A | 4/1984 | Tong et al. | 381/68 |
| 4,484,345 A | 11/1984 | Stearns | 381/98 |
| 4,490,585 A | 12/1984 | Tanaka | 179/107 FD |
| 4,515,158 A | 5/1985 | Patrick et al. | 128/419 R |
| 4,517,415 A | 5/1985 | Laurence | 179/107 FD |
| 4,590,459 A | 5/1986 | Lanz et al. | 340/347 AD |
| 4,596,902 A | 6/1986 | Gilman | 179/107 FD |
| 4,611,598 A | 9/1986 | Hortmann et al. | 128/419 R |
| 4,658,426 A | 4/1987 | Chabries et al. | 381/94 |
| 4,696,032 A | 9/1987 | Levy | 379/390 |
| 4,739,305 A | 4/1988 | Naito | 340/347 AD |
| 4,750,207 A | 6/1988 | Gebert et al. | 381/68.4 |
| 4,790,018 A | 12/1988 | Preves et al. | 381/68.4 |
| 4,791,672 A | 12/1988 | Nunley et al. | 381/68.2 |
| 4,792,977 A | 12/1988 | Anderson et al. | 381/68.4 |
| 4,852,175 A | 7/1989 | Kates | 381/68.4 |
| 4,882,762 A | 11/1989 | Waldhauer | 381/106 |
| 4,956,867 A | 9/1990 | Zurek et al. | 381/94.1 |
| 4,972,487 A | 11/1990 | Mangold et al. | 381/68 |
| 5,027,306 A | 6/1991 | Dattorro et al. | 364/724.1 |
| 5,027,410 A | 6/1991 | Williamson et al. | 381/68.4 |
| 5,059,981 A | 10/1991 | Hauser | 341/164 |
| 5,083,312 A | 1/1992 | Newton et al. | 381/68.4 |
| 5,103,230 A | 4/1992 | Kalthoff et al. | 341/166 |
| 5,111,419 A | 5/1992 | Morley, Jr. et al. | 364/724.19 |
| 5,170,434 A | 12/1992 | Anderson | 381/68 |
| 5,225,836 A | 7/1993 | Morley, Jr. et al. | 364/150 |
| 5,233,665 A | 8/1993 | Vaughn et al. | 381/97 |
| 5,241,310 A | 8/1993 | Tiemann | 341/143 |
| 5,285,502 A | 2/1994 | Walton et al. | 381/94 |
| 5,357,251 A | 10/1994 | Morley, Jr. et al. | 341/172 |
| 5,402,496 A | 3/1995 | Soli et al. | 381/94 |
| 5,475,759 A | 12/1995 | Engebretson | 381/68.2 |
| 5,590,065 A * | 12/1996 | Lin | 708/313 |
| 5,606,296 A | 2/1997 | Seong | 332/109 |
| 5,687,242 A | 11/1997 | Iburg | 381/69.2 |
| 5,710,819 A | 1/1998 | Topholm et al. | 381/68.2 |
| 5,710,820 A | 1/1998 | Martin et al. | 381/68.4 |
| 5,777,908 A * | 7/1998 | Inogai | 708/313 |
| 5,848,171 A | 12/1998 | Stockham, Jr. et al. | 381/321 |
| 5,867,581 A | 2/1999 | Obara | 381/312 |
| 5,880,973 A * | 3/1999 | Gray et al. | 708/313 |
| 5,907,299 A | 5/1999 | Green et al. | 341/143 |
| 5,963,106 A | 10/1999 | Blyth et al. | 332/109 |
| 5,995,036 A | 11/1999 | Nise et al. | 341/172 |
| 6,023,517 A | 2/2000 | Ishige | 381/315 |
| 6,044,162 A | 3/2000 | Mead et al. | 381/312 |
| 6,072,885 A | 6/2000 | Stockham, Jr. et al. | 381/321 |
| 6,163,287 A | 12/2000 | Huang | 341/143 |

OTHER PUBLICATIONS

Chabries, et al., Application of a Human Auditory Model to Loudness Perception and Hearing Compensation:, 1995, IEEE, pp. 3527–3530.

"Delta–Sigma Overview", Fall 1996, ECE 627, pp. 1–29.

Etter, e al., "Noise Reduction by Noise–Adaptive Spectral Magnitude Expansion", May 1994, J. Audio Eng. Soc., vol. 42, No. 5, pp. 341–348.

Kaelin et al., "A Digital Frequency–Domain Implementation of a Very High Gain Hearing Sid with Compensation for Recruitment of Loudness and Acoustic Echo Cancellation", 1998, Signal Processing, 64, pp. 71–85.

Karema, et al., "An Oversampled Sigma–Delta AD Converter Circuit Using Two–Stage Fourth Order Modulator", 1990, IEEE, pp. 3279–3282.

Kates, James M., "Feedback Cancellation in Hearing Aids: Results from a Computer Simulation", Mar. 1991, IEEE Transactions on Signal Processing, vol. 39, No. 3, pp. 553–562.

Kuo, et al. "Integrated Frequency–Domain Digital Hearing Aid with the Lapped Transform", Sep. 10, 1992, Northern Illinois University, Department of Electrical Engineering, 2 pages.

Maxwell, et al., "Reducing Acoustic Feedback in Hearing Aids", 1995, IEEE, pp. 304–313.

Norsworthy, et al., "Delta–Sigma Data Converters", IEEE Circuits & Systems Society, pp. 321–324.

Quatieri, et al., "Noise Reduction Based on Spectral Change", MIT Lincoln Laboratory, Lexington, MA.

Riley, et al., "High Decimation Digital Filters", 1991, IEEE, pp. 1613–1615.

Siqueira et al., "Subband Adaptive Filtering Applied to Acoustic Feedback Reduction in Hearing Aids", 1997, IEEE, pp. 788–792.

Wyrsch et al., "Adaptive Feedback Cancelling in Subbands for Hearing Aids", Swiss Federal Institute of Technology, Signal and Information Processing Laboratory, 4 pages.

Boll, S., "Suppression of Acoustic Noise in Speech Using Spectral Subtraction," Apr. 1979, IEEE Trans. on ASSP, vol. ASSP–27, pp. 113–120.

Brey, Robert H. et al., "Improvement in Speech Intelligibility in Noise Employing an Adaptive Filter with Normal and Hearing–Impaired Subjects," Journal of Rehabilitation Research and Development, vol. 24, No. 4, pp. 75–86.

Chabries, Douglas M. et al., "Application of Adaptive Digital Signal Processing to Speech Enhancement for the Hearing Impaired", Journal of Rehabilitation Research and Development, vol. 24, No. 4, pp. 65–74.

Chabries, et al., "Noise Reduction by Amplitude Warping in the Spectral Domain in a Model–Based Algorithm", Jun. 11, 1997, Etymotic Update, No. 15.

Crozier, P. M., et al., "Speech Enhancement Employing Spectral Subtraction and Linear Predictive Analysis," 1993, Electronic Letters, 29(12): 1094–1095.

Karema, et al., "An Oversampled Sigma–Delta A/D Connector Circuit using Two–Stage Fourth Order Modulator".

Lee et al., "A Self–Calibrating 15 Bit CMOS A/D Converter", Dec. 1984, IEEE, J. Solid–State Circuits, vol. SC–19, No. 6, pp. 813–819.

* cited by examiner

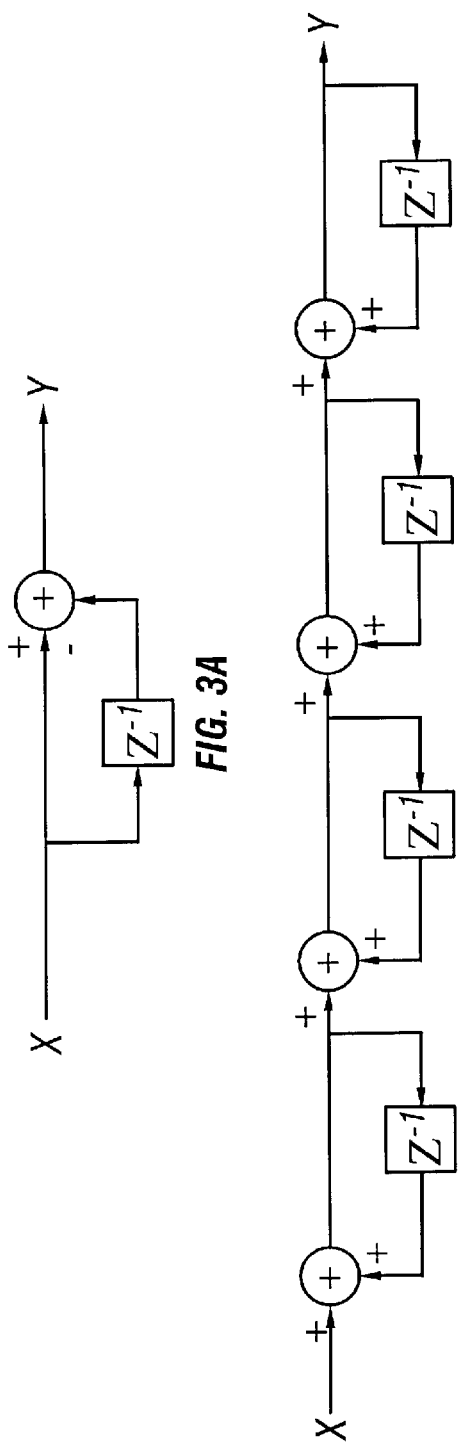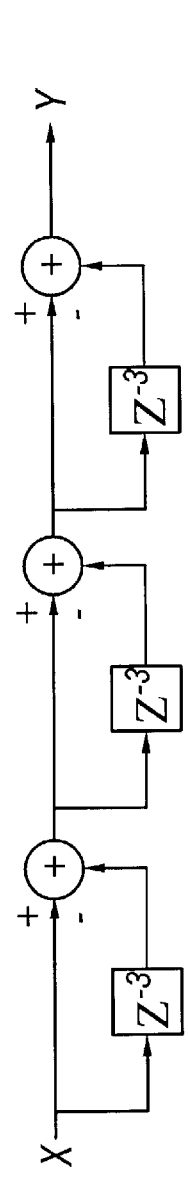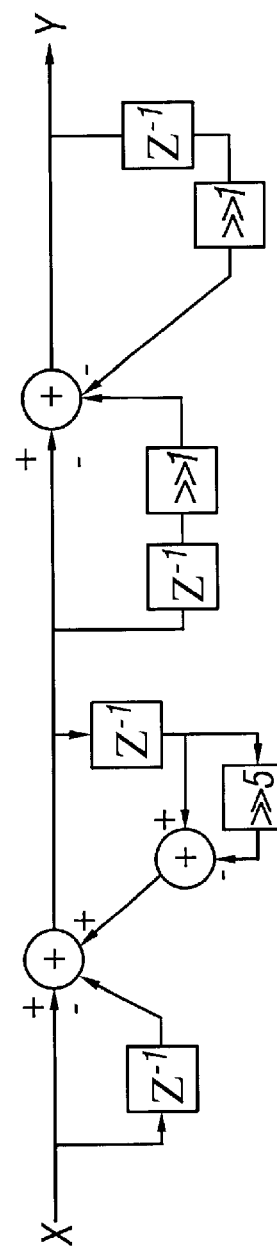
FIG. 3A  FIG. 3B  FIG. 3C  FIG. 4

MULTIPLE STAGE DECIMATION FILTER

BACKGROUND OF THE INVENTION

1. Field of the Invention

The present invention relates to decimation filters employed for use in an A/D converter that oversamples the analog signal input to the A/D converter. More particularly, the present invention relates to a multiple stage decimation filter that employs cascaded comb filters and a zero insertion filter to provide high attenuation in the stop band to effectively suppress quantization noise and attenuate out-of-band noise, and a steep transition between the pass band and the stop band.

2. The Prior Art

It is common in audio design and in various types of signal processing to employ an A/D modulator in an A/D converter that samples a signal well above the Nyquist rate to obtain a high resolution A/D converter, since it is well known that the resolution of a Nyquist rate A/D converter is limited by the injection of noise from the digital portion of the A/D modulator that is aliased into the passband. Further, a Nyquist rate A/D converter requires effective anti-aliasing filters, high performance sample and hold circuits and jitter free timing.

An A/D modulator that samples the analog input signal at a rate well above the Nyquist rate is termed an oversampling A/D modulator. Though different type of oversampling A/D modulators are known, a widely employed oversampling A/D modulator is the delta-sigma modulator. The delta-sigma modulator is often employed because it may be implemented using relatively simple and high-tolerance analog components, while maintaining good linearity because the delta-sigma modulator typically employs single-bit quantization.

In the A/D converter, the A/D modulator oversamples the analog signal at a frequency well above the Nyquist rate to form short digital words, and the decimator inputs these short words, and down samples them to form an output of longer words at the Nyquist rate. Processing signals at the Nyquist rate is well known and understood by those of ordinary skill in art, and accordingly will not be described herein in detail, however, it should be appreciated that the Nyquist frequency is twice the cutoff frequency for the signal being sampled.

Because the sample rate of the over-sampled A/D modulator is requires complex circuitry for signal processing, the bit stream form the A/D modulator is commonly decimated by a decimation filter to provide a sample rate that can be more readily processed. The downsampling order of the decimation, D, is the ratio of the oversampling frequency, Fs, to the Nyquist frequency, Fn. For an A/D converter employing an oversampled A/D modulator, the decimation filter should have a steep transition between the passband and the stopband to avoids the use of an anti-aliasing analog filter on the front end of the A/D converter. Further, the decimation filter should suppress or attenuate noise.

There are typically two types of noise that the decimation filter must suppress or attenuate. These are quantization noise and out-of-band noise or signal. Quantization noise is created by the A/D modulator in the transformation of the analog input to the digital output, and is considered by those of ordinary skill in the art as an error signal. Quantization noise is typically quite minimal in the base band, however, quantization noise can become quite severe in higher frequency bands above the base band. Out-of-band noise and signal are signals occurring at a frequency that is outside the selected frequency range of the analog signal that is being converted to a digital signal.

To meet these criteria in the decimation filter, a one stage finite impulse response filter (FIR) or a one stage infinite impulse response filter (IIF) is quite complicated and difficult to implement. A multi-stage, multi-rate decimation filter as an efficient manner of implementing the decimation filter has been proposed by Karema, et al. "An Oversampled Sigma-Delta Converter Circuit Using Two-Stage Fourth Order Modulator", IEEE Proceedings ISCAS '90, pp. 3279–3282, May 1990.

Karema et al. discloses a two-stage decimation filter. The first stage in the decimation filter employs a cascade of comb filters with a length of D0, D0+1 or D0+2, for the decimation of the oversampled bit stream to 4Fn or 2Fn. As is well understood by those of ordinary skill in the art, the length D0 is the downsampling order of the first stage and is commonly equal to D/4 or D/2. As described above, D represents the overall downsampling order of the decimation, and is the ratio of Fs to Fn. The cascade of comb filters is relatively simple and provides attenuation in the stopband. The second stage of the decimation filter is a quarter band or half band filter that requires relatively less restriction on the stop band, but requires a steep transition. The second stage of the decimation filter is more complicated to implement than the first stage.

Although known decimation filters provide some amount attenuation in the stopband and some degree of steepness in transition between the stopband and the passband, there exists a need for greater attenuation in the stopband and a greater degree of steepness between the stopband and the passband than is presently provided in the art. Further, there also exists a need to realize the implementation of the decimation filter in very efficient manner to reduce the silicon area in an integrated circuit required by the decimation filter.

BRIEF DESCRIPTION OF THE INVENTION

According to the present invention, a decimator is implemented as a filter having high attention in the stop band and a steep transition between the stop band and the pass band of the decimation filter. The high attenuation in the stop band and a steep transition between the stop band and the pass band of the filter implementing the decimator are desired to prevent the quantization noise and out-of-band noise or signal from aliasing back into the base band after the high sample rate output from the A/D modulator is down sampled by the decimator.

According to the present invention, a decimator includes a zero insertion filter having an input and an output, wherein the input forms an input of the decimation filter. The input to the zero insertion filter is a 1-bit input stream oversampled at 1.28 MHz. The output of the zero insertion filter is a 6-bit word at a sample rate of 1.28 MHz. The output of the zero insertion filter is coupled to a cascade of four comb filters having a first accumulator stage and a second stage having a first differentiator portion and second differentiator portion wherein the first stage has an input coupled to the output of the zero insertion filter and an output, the first differentiator portion has an input coupled to the output of the first stage and an output, and the second differentiator portion has an input coupled to the output of the first differentiator portion and an output. A down sampling of 32 occurs in the first accumulator stage to provide a 31-bit word at a sample rate of 40 KHz. A down sampling of 2 occurs in the first differentiator portion of the second stage to provide a 31-bit word at a sample rate of 20 KHz. The output of the second differentiator portion of the second stage is a 26-bit word at a sample rate of 20 KHz. A frequency shaping filter having an input and an output, wherein the input is coupled to the output of the second differentiator portion, performs a 26-bit addition and substraction to provide a 16-bit output that forms an output of the decimation filter, According to another aspect of the present invention, the zero insertion filter includes a serial shift register and an adder. The serial shift register is implemented as a four phase delay line to reduce the number of storage units in the serial shift register that are required for a given number of delay time periods. In the four phase delay line for serial shift register there are storage cells which are divided sequentially into groups of three storage cells. After each group of three storage cells, a free storage cell is disposed. Four non-overlapping clock signals CLK0, CLK1, CLK2, and CLK3 are provided to each of the storage cells and the free storage cells, respectively. By employing a four phase delay line to implement the serial shift register, rather than the more common two-phase delay line that includes a free storage cell between each storage cell, the amount of integrated circuit area required to implement the serial shift register is significantly reduced.

BRIEF DESCRIPTION OF THE DRAWINGS

FIG. 3A is signal flow diagram of the first stage of the cascade of comb filters according to the present invention.

FIG. 3B is signal flow diagram of the first portion of the second stage of the cascade of comb filters according to the present invention.

FIG. 3C is signal flow diagram of the second portion of the second stage of the cascade of comb filters according to the present invention.

FIG. 4 is signal flow diagram of the frequency shaping filter according to the present invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, a decimator suitable for use with an oversampled A/D modulator in an A/D converter is disclosed herein. The decimator is implemented as a filter having high attention in the stop band and a steep transition between the stop band and the pass band of the decimation filter. According to the present invention, the high attenuation in the stop band and a steep transition between the stop band and the pass band of the filter implementing the decimator are desired to prevent the quantization noise and out-of-band noise or signal from aliasing back into the base band after the high sample rate output from the A/D modulator is down sampled by the decimator.

Figure 1A:
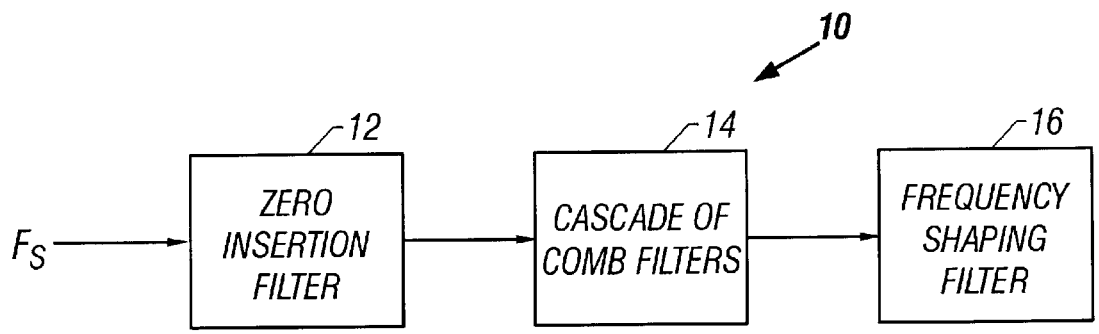
FIG. 1A is a block diagram of a decimation filter including a zero insertion filter, a cascade of comb filters, and a frequency shaping filter according to the present invention.
Figure 1B:
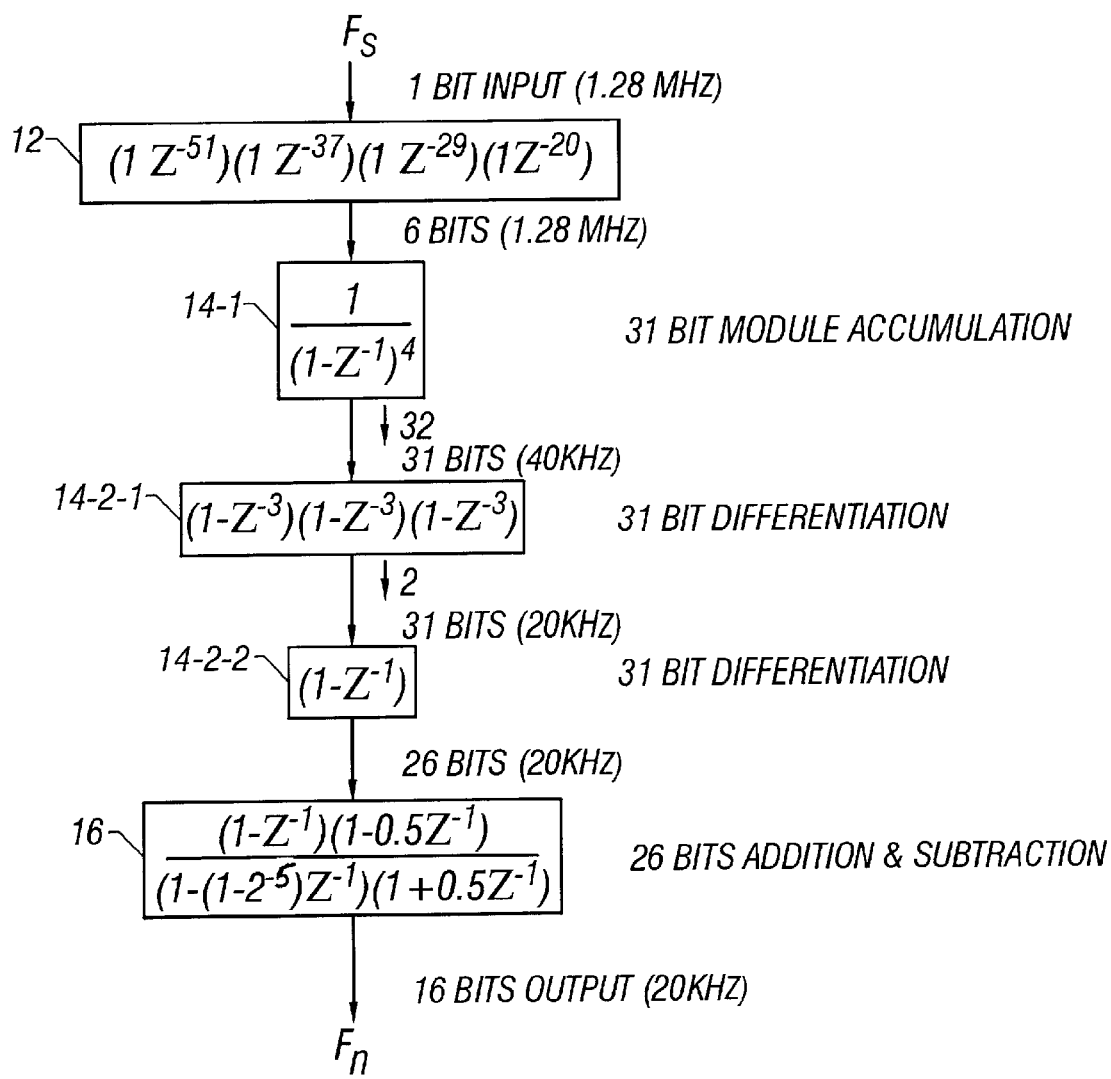
FIG. 1B is a block diagram illustrating the transfer functions of the decimation filter of FIG. 1A according to the present invention.

Turning now to FIGS. 1A and 1B, block diagrams of a decimation filter 10 according to the present invention are illustrated. In decimation filter 10, a digital signal, Fs, sampled and output from an A/D modulator at a frequency of 1.28 MHz is fed into a zero insertion filter 12. The output of zero insertion filter 12 is input at a frequency of 1.28 MHz to a cascade of comb filters 14. As the digital signal passes through the cascade of comb filters 14, the digital signal is down sampled to 20 KHz. The output of the cascade of comb filters 14 is fed into a frequency shaping filter 16. The output of the frequency shaping filer is a digital signal, Fn, at the Nyquist frequency. Since the over sampling rate, Fs, is 1.28 MHz and the Nyquist frequency, Fn, is 20 KHz, the decimation order, D, of the decimation filter 10 is 64. The zero insertion filter 12, the cascade of comb filters 14, and the frequency shaping filter 16 provide the filter characteristics to the decimation filter 10.

The zero insertion filter 12 is employed to provide a steeper transition between the passband and the stopband. The zero insertion filter 12 implements a steeper transition between the passband and the stopband by adding zeros around the cutoff frequency. The additional zeros provided by the zero insertion filter 12 notch out the filter around the cutoff frequency. According to the present invention, the zero insertion filter 12 may be expressed as the following transfer function:

$$H(Z) = \prod_{i=0}^{m} 1 + Z^{-M_i}$$

In order to achieve a dynamic range of greater than 90 dB, the parameters for the transfer function of the zero insertion filter 12 were chosen as m=3, and $M_0$=51, $M_1$=37, $M_2$=29, $M_3$=20. Accordingly, the transfer function is represented by the following expression:

$$(1+Z^{-51})(1+Z^{-37})(1+Z^{-29})(1+Z^{-20})$$

Figure 2:
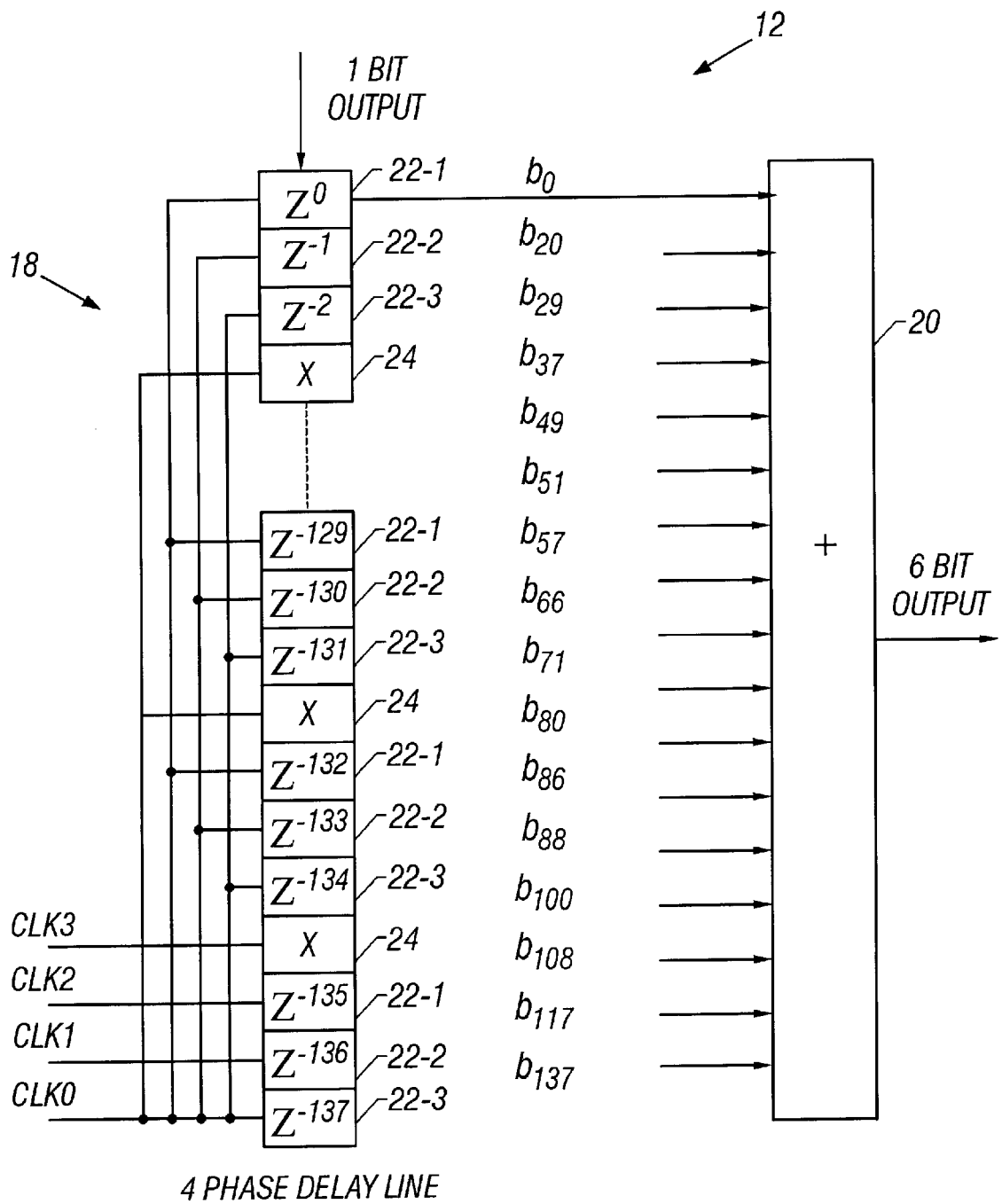
FIG. 2 is block diagram of a zero insertion filter suitable for use according to the present invention.

An implementation of the transfer function for the zero insertion filter 12 is illustrated in FIG. 2. The zero insertion filter includes a 138-bit serial shift register 18 and an adder 20. The output of the zero insertion filter 12 is formed as a 6-bit output of the adder 20. According to the present invention, the 138-bit serial shift register 18 is implemented as a four phase delay line to reduce the number of storage units in the 138-bit serial shift register 20 that are required for a given number of delay time periods. It should be appreciated that other implementations of the zero insertion filter 12 are known to those of ordinary skill in the art.

In the four phase delay line for the 138-bit serial shift register 18, there are 138 storage cells 22 labelled as $Z^0$ through $Z^{-137}$. These 138 storage cells are divided sequentially into groups of three storage cells 22-1, 22-2 and 22-3. After each group of three storage cells 22-1, 22-2 and 22-3, a free storage cell 24 labelled X is disposed. (There is not a free storage cell 24 after cell $Z^{-137}$ because the data is simply shifted out of the storage register 18). Four non-overlapping clock signals CLK0, CLK1, CLK2, and CLK3 are provided to each of the storage cells 22-3, 22-2, 22-1 and the free storage cells 24, respectively. By employing a four phase delay line to implement the 138-bit serial shift register 18, rather than the more common two-phase delay line that includes a free storage cell between each storage cell, the amount of integrated circuit area required to implement the 138-bit serial shift register 18 is significantly reduced.

In the operation of the shift register 18, the four non-overlapping clock signals CLK0, CLK1, CLK2, and CLK3 are separately applied to the storage cells 22-3, 22-2, 22-1 and the free storage cells 24, respectively. First, the CLK0 signal is asserted to shift the contents of storage cells 22-3 into the free storage cells 24. Next, the CLK1 signal is asserted to shift the contents of storage cells 22-2 into the storage cells 22-3. Next, the CLK2 signal is asserted to shift the contents of storage cells 22-1 into the storage cells 22-2. Finally, the CLK3 signal is asserted to shift the contents of the free storage cells 24 into the storage cells 22-1. The bits b0, b20, b29, b37, b49, b51, b57, b66, b71, b80, b86, b88, b100, b108, b117, and b137, associated with the corresponding storage cells 22-1, 22-2 and 22-3, as shown for example by the b0 bit associated with the storage cell 22-1 labelled $Z^0$, are summed in the adder 20 to provide the six bit output of the zero insertion filter 12.

The cascade of comb filters 14 can be expressed by the following transfer function:

$$H(Z) = \prod_{i=0}^{n} \frac{1 - Z^{-N_i}}{1 - Z^{-1}}$$

To achieve a dynamic range of greater than 90 dB, the parameters in the transfer function for the cascade of four comb filters 14 are n=3, $N_0$=64, and $N_1$=$N_2$=$N_3$=96. With $N_0$=64, the length of the first comb filter is 64 and with $N_1$=$N_2$=$N_3$=96, the length of the second, third and fourth comb filters is 96. It should be appreciated that the four cascaded comb filters each have a length that is much greater than the DO length of the comb filters previously employed. According to the present invention, the cascade of comb filters 14 is implemented in two stages 14-1 and 14-2.

The first stage 14-1 of the cascade of comb filters 14 implementing the denominator of the transfer function of the cascade of comb filters 14 has the 6-bit output of the zero insertion filter 12 as an input. A 31 bit modulo accumulation is performed at 1.28 MHz that implements the following expression:

$$\frac{1}{(1 - Z^{-1})^4}$$

A signal flow diagram implementing the first stage 14-1 is depicted in FIG. 3A. The signal sample delays are denoted in the signal flow diagram as $Z^{-1}$. Different circuit implementations for signal flow diagram of the first stage 14-1 depicted in FIG. 3A are well known in the art and will not be included herein to avoid overcomplicating the disclosure and obscuring the present invention. The outputs of the first stage 14-1 are 32-bit words which are down sampled by a factor of 32 such that every 32nd 32-bit word is selected as an input to the second stage 14-2.

The second stage 14-2 of the cascade of comb filters 14 implementing the numerator of the transfer function of the cascade of comb filters 14 is separated into two portions 14-2-1 and 14-2-2. The first portion 14-2-1 of the second stage 14-2 of the cascade of comb filters 14 operates on 31 bits at a rate of 40 KHz due to the down sampling between the first and second stages 14-1 and 14-2, respectively, of the cascade of comb filters 14. The first portion 14-2-1 of the second stage 14-2 of the cascade of comb filters 14 may be implemented by the following expression:

$$(1-Z^{-3})(1-Z^{-3})(1-Z^{-3})$$

A signal flow diagram implementing the first portion 14-2-1 of the second stage 14-2 is depicted in FIG. 3B. The signal sample delays are denoted in the signal flow diagram as $Z^{-1}$. Different circuit implementations for signal flow diagram of the first portion 14-2-1 of the second stage 14-2 as depicted in FIG. 3B are well known in the art and will not be included herein to avoid overcomplicating the disclosure and obscuring the present invention.

The output of the first portion 14-2-1 of the second stage 14-2 of the cascade of comb filters 14 are 31-bit words which are down sampled by a factor of 2 such that every other 31-bit word is selected as an input to the second portion 14-2-2 of the second stage 14-2 of the cascade of comb filters 14. The second portion 14-2-2 of the second stage 14-2 operates on 31 bits at a rate of 20 KHz. The second portion 14-2-2 of the second stage 14-2 of the cascade of comb filters 14 may be implemented by the following expression:

$$(1-Z^{-1})$$

A signal flow diagram implementing the second portion 14-2-2 of the second stage 14-2 is depicted in FIG. 3C. The signal sample delays are denoted in the signal flow diagram as $Z^{-3}$. Different circuit implementations for signal flow diagram of the first portion 14-2-2 of the second stage 14-2 as depicted in FIG. 3C are well known in the art and will not be included herein to avoid overcomplicating the disclosure and obscuring the present invention.

It is known that either cascading comb filters or employing comb filters of a longer length increases attenuation in the stop band of a filter and improves the steepness of the transition between the passband and the stopband. However, unlike the prior art described above, that employs comb filters of the same length, such as D0, D0+1 or D0+2 followed by a half-band or quarter-band filter, the cascade of comb filters 14 of the present invention employ a longer length on the order of D to 2D, without the additional half-band or quarter-band filter. The comb filters in the cascade of comb filters 14 according to the present invention may be either of the same length or of different lengths.

The frequency shaping filter 16 operates at 20 KHz on 26 bits of inputs from the output of the second portion 14-2-2 of the second stage 14-2 of the cascade of comb filters 14. The frequency shaping filter 16 performs 26 bit addition and subtraction to form an output of 16 bits at 20 KHz. The frequency shaping filter 16 is implemented by the following transfer function:

$$H(Z) = \frac{(1 - Z^{-1})(1 - 0.5\,Z^{-1})}{(1 - (1 - 2^{-5})Z^{-1})(1 + 0.5\,Z^{-1})}$$

A signal flow diagram implementing the frequency shaping filter 16 is depicted in FIG. 4. The signal sample delays are denoted in the signal flow diagram as $Z^{-1}$. Different circuit implementations for signal flow diagram of the frequency shaping filter 16 as depicted in FIG. 4 are well known in the art and will not be included herein to avoid overcomplicating the disclosure and obscuring the present invention.

Figure 5:
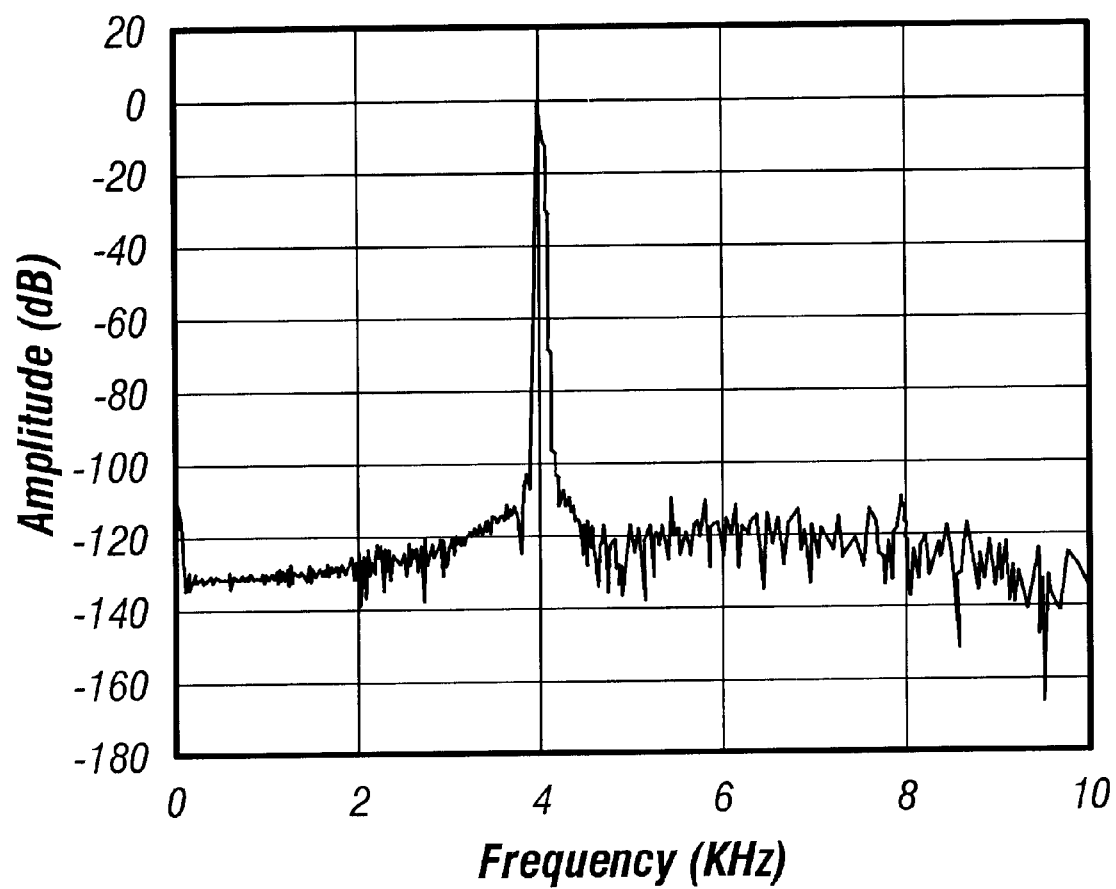
FIG. 5 is a graph of the output of a decimation filter according to the present invention in response to a 4 KHz signal from a 3rd order A/D modulator.

In FIG. 5, the output of the decimation filter 10 according to the present invention in response to a 4 KHz signal form a 3rd order A/D modulator is illustrated. From the output spectrum illustrated in FIG. 5, by integrating the noise over the entire baseband, the signal-to-noise ratio is determined to be 93 dB.

While embodiments and applications of this invention have been shown and described, it would be apparent to those skilled in the art that many more modifications than mentioned above are possible without departing from the inventive concepts herein. The invention therefore, is hot to be restricted except in the spirit of the appended claims.

What is claimed is:

1. A decimation filter comprising:

a zero insertion filter having an input and an output, said input forming an input of said decimation filter;

a cascade of comb filters having a first accumulator stage and a second stage having a first differentiator portion and second differentiator portion, said first stage having an input coupled to said output of said zero insertion filter and an output, said first differentiator portion having an input coupled to said output of said first stage and an output, and said second differentiator portion having an input coupled to said output of said first differentiator portion and an output; and a frequency shaping filter having an input and an output, said input coupled to said output of said second differentiator portion and said output forming an output of said decimation filter.

* * * * *